(12) United States Patent
Kang et al.

(10) Patent No.: US 7,307,872 B2
(45) Date of Patent: Dec. 11, 2007

(54) NONVOLATILE SEMICONDUCTOR STATIC RANDOM ACCESS MEMORY DEVICE

(75) Inventors: Hee Bok Kang, Daejeongwangyeok-si (KR); Jin Hong Ahn, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/296,434

(22) Filed: Dec. 8, 2005

(65) Prior Publication Data
US 2006/0268615 A1 Nov. 30, 2006

(30) Foreign Application Priority Data
May 30, 2005 (KR) .................. 10-2005-0045478

(51) Int. Cl.
*G11C 11/00* (2006.01)
(52) U.S. Cl. ............... 365/154; 365/117; 365/109; 365/65; 365/145
(58) Field of Classification Search .......... 365/154, 365/117, 109, 145, 65
See application file for complete search history.

(56) References Cited
U.S. PATENT DOCUMENTS

| | | | | |
|---|---|---|---|---|
| 4,263,664 A | * | 4/1981 | Owen et al. | ............ 365/185.08 |
| 5,146,299 A | * | 9/1992 | Lampe et al. | ................ 257/295 |
| 5,390,143 A | | 2/1995 | Manning | |
| 5,629,888 A | * | 5/1997 | Saito et al. | .................. 365/145 |
| 5,751,627 A | * | 5/1998 | Ooishi | .......................... 365/145 |
| 5,914,895 A | * | 6/1999 | Jenne | .................... 365/185.08 |
| 5,986,932 A | * | 11/1999 | Ratnakumar et al. | .. 365/185.07 |
| 6,026,018 A | | 2/2000 | Herdt et al. | |
| 6,064,590 A | | 5/2000 | Han et al. | |
| 6,097,618 A | * | 8/2000 | Jenne | ........................ 365/63 |
| 6,414,873 B1 | | 7/2002 | Herdt | |
| 6,556,487 B1 | * | 4/2003 | Ratnakumar et al. | .. 365/189.08 |
| 6,730,950 B1 | * | 5/2004 | Seshadri et al. | ............ 257/295 |
| 6,738,281 B2 | * | 5/2004 | Yokozeki | .................... 365/145 |
| 6,882,559 B2 | * | 4/2005 | Masui et al. | ................. 365/145 |
| 7,057,917 B2 | * | 6/2006 | Ogiwara et al. | ............ 365/145 |
| 7,110,283 B2 | * | 9/2006 | Takahashi et al. | .......... 365/154 |
| 2005/0073876 A1 | | 4/2005 | Chen et al. | |

(Continued)

FOREIGN PATENT DOCUMENTS

JP       02000293989 A  * 10/2000

(Continued)

*Primary Examiner*—Viet Q. Nguyen
(74) *Attorney, Agent, or Firm*—Townsend and Townsend and Crew LLP

(57) ABSTRACT

A nonvolatile semiconductor memory device obtained by combining a nonvolatile memory device with a SRAM is provided to improve operating speed and reliability. The nonvolatile semiconductor memory device includes a plurality of data registers. Preferably, each of the plurality of data registers includes a pull-up driving unit adapted and configured to pull up a storage node, a pull-down driving unit adapted and configured to pull down the storage node, a data input/output unit adapted and configured to selectively input and output data between a bit line and the storage node depending on a voltage applied to a word line, and a data storing unit adapted and configured to store data of the storage node depending on a voltage applied to a top word line and a bottom word line or to output the stored data to the storage node.

17 Claims, 9 Drawing Sheets

U.S. PATENT DOCUMENTS

2005/0141267 A1   6/2005   Kwon
2005/0162896 A1   7/2005   Jung

FOREIGN PATENT DOCUMENTS

| | | | | |
|---|---|---|---|---|
| JP | 02001167584 A | * | 6/2001 |
| JP | 02004153700 A | * | 5/2004 |
| JP | 02004220021 A | * | 8/2004 |
| JP | 02004348939 A | * | 12/2004 |
| JP | 02005276315 A | * | 10/2005 |

* cited by examiner

NONVOLATILE SEMICONDUCTOR STATIC RANDOM ACCESS MEMORY DEVICE

BACKGROUND OF THE INVENTION

1. Field of the Invention

The present invention generally relates to a nonvolatile semiconductor memory device, and more specifically concerns a memory device combining a nonvolatile memory device with a Static Random Access Memory (hereinafter, referred to as "SRAM").

2. Description of the Related Art

FIG. 1 is a circuit diagram illustrating a data register of a conventional SRAM. Here, a plurality of data registers are connected to form a SRAM.

The data register comprises a pull-up driving unit 2, a pull-down driving unit 4 and a data input/output unit 6.

The pull-up driving unit 2 comprises PMOS transistors PT1 and PT2 whose gates are cross-coupled with a latch type circuit.

The pull-down driving unit 4 comprises NMOS transistors NT1 and NT2 whose gates are cross-coupled with a latch type circuit.

The data input/output unit 6 comprises switches NT3 and NT4 configured to selectively input and output data with bit lines BL and /BL depending on a voltage applied to a word line WL. Here, the switches NT3 and NT4 are NMOS transistors whose gates are connected to the word line WL.

Hereinafter, the operation of the register of the conventional SRAM is described.

At a write mode, when high level data are loaded on the true bit line BL and a driving voltage Vpp is applied to the word line WL, the switches NT3 and NT4 of the data input/output unit 4 are turned on. Here, the complement bit line /BL is set at a low level.

In the pull-up driving unit 2, the first PMOS transistor PT1 is turned on, and the second PMOS transistor PT2 is turned off.

In the pull-down driving unit 4, the first NMOS transistor NT1 is turned off, and the second NMOS transistor NT2 is turned on.

Here, when the driving voltage Vpp applied to the word line WL is intercepted, the high level data are latched by the pull-up driving unit 2 and the pull-down driving unit 4.

At a read mode, when the driving voltage Vpp is applied to the word line WL, the switches NT3 and NT4 of the data input/output unit 6 are turned on.

For example, when the high level data are stored, the first PMOS transistor PT1 of the pull-up driving unit 2 is turned on, so that the high level data are loaded in the true bit line BL. Here, the second NMOS transistor NT1 of the pull-down driving unit 4 is turned on, so that the complement bit line /BL is set at the low level.

Although the example where the high level data are stored or read is described herein, the low level data are also stored or read by the same operation as described above.

However, the conventional volatile data register loses the stored data when a power is turned off.

SUMMARY OF THE INVENTION

Various embodiments are directed at preventing stored data from being destroyed even when a power source is intercepted.

According to one embodiment of the present invention, a nonvolatile semiconductor memory device is provided with a plurality of data registers. Preferably, each of the plurality of data registers comprises a pull-up driving unit adapted and configured to pull up a storage node, a pull-down driving unit adapted and configured to pull down the storage node, a data input/output unit adapted and configured to selectively input and output data between a bit line and the storage node depending on a voltage applied to a word line, and a data storing unit adapted and configured to store data of the storage node depending on a voltage applied to a top word line and a bottom word line or to output the stored data to the storage node.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
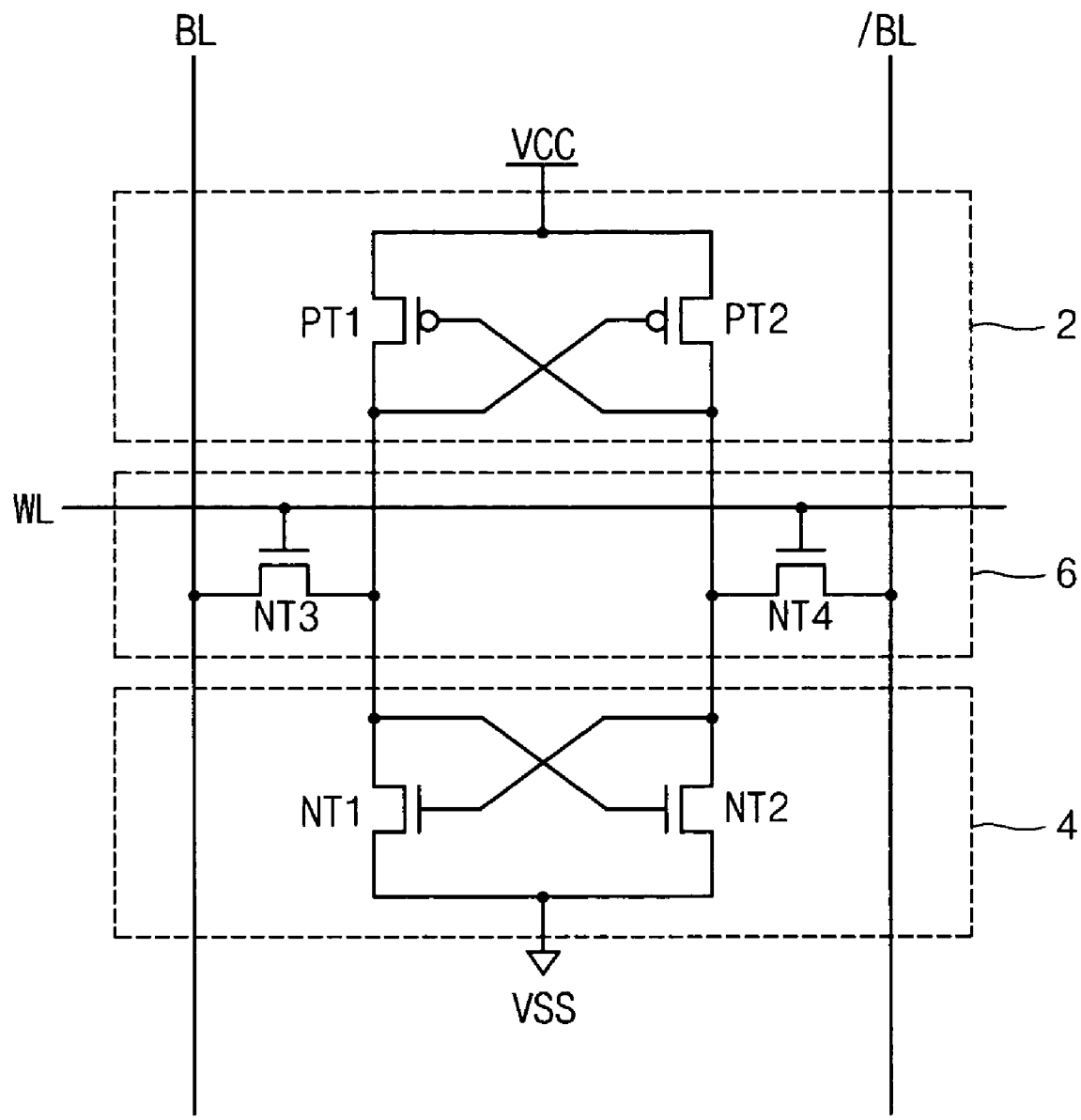
FIG. 1 is a circuit diagram illustrating a data register of a conventional SRAM.
Figure 2:
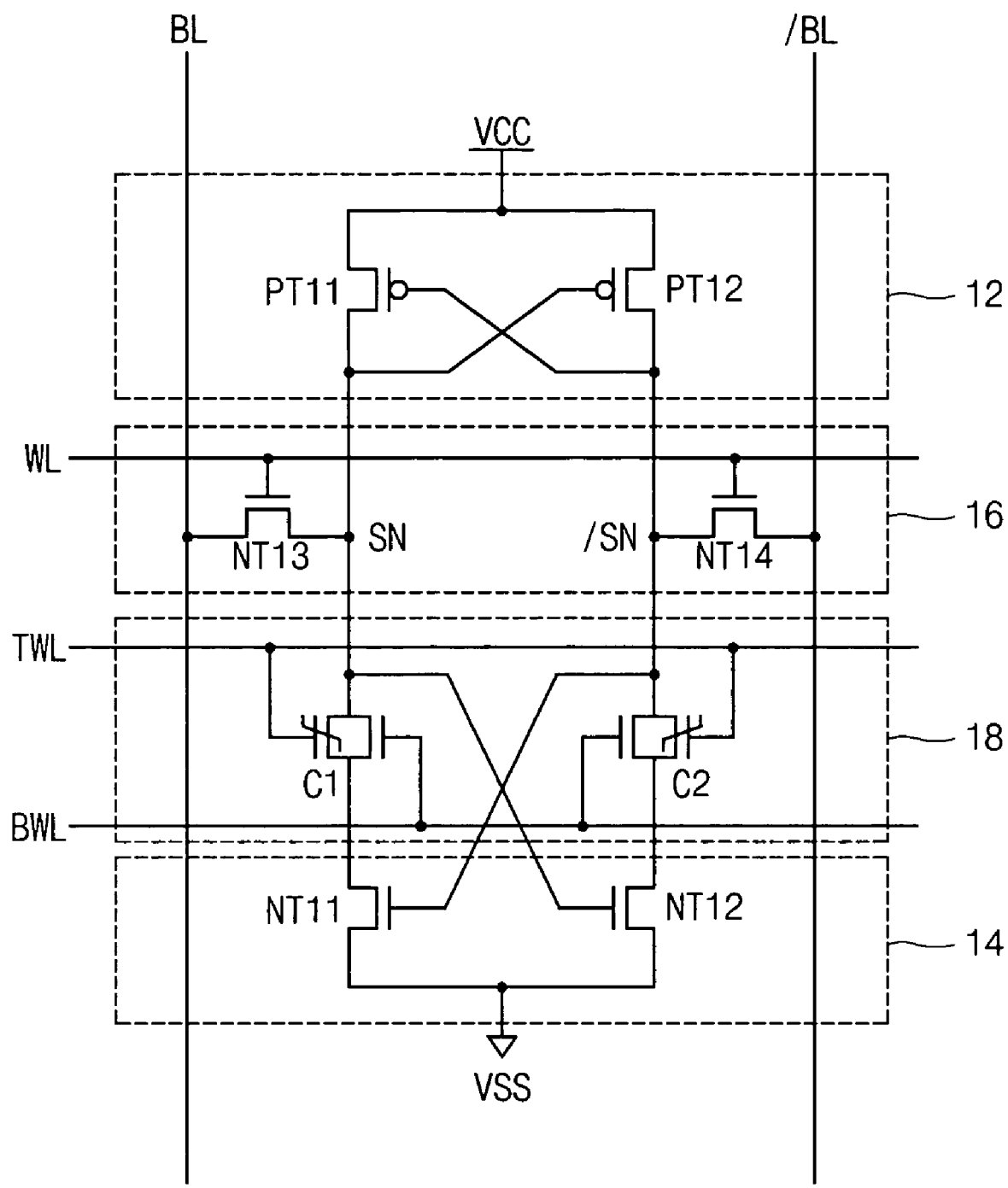
FIG. 2 is a circuit diagram illustrating a data register of a nonvolatile SRAM according to an embodiment of the present invention.

FIG. 2 is a circuit diagram illustrating a data register of a nonvolatile SRAM according to an embodiment of the present invention. Here, a plurality of data registers are connected to form a nonvolatile SRAM.

In this embodiment, the data register comprises a pull-up driving unit 12, a pull-down driving unit 14, a data input/output unit 16 and a data storing unit 18.

The pull-up driving unit 12 comprises PMOS transistors PT11 and PT12 whose gates are cross-coupled to storage terminals SN and /SN with a latch type circuit.

The pull-down driving unit 14 comprises NMOS transistors NT11 and NT12 whose gates are cross-coupled to the storage terminals SN and /SN with a latch type circuit.

The data input/output unit 16 comprises switches NT13 and NT14 configured to selectively input and output data between the bit lines BL, /BL and the storage terminals SN, /SN depending on a voltage applied to the word line WL. Here, the switches NT13 and NT14 are NMOS transistors whose gates are connected to the word line WL.

The data storing unit 18 comprises data cells C1 and C2 configured to store data of the storage nodes SN and /SN or output the stored data to the storage nodes SN and /SN depending on a voltage applied to a top word line TWL and a bottom word line BWL.

Figure 3A:
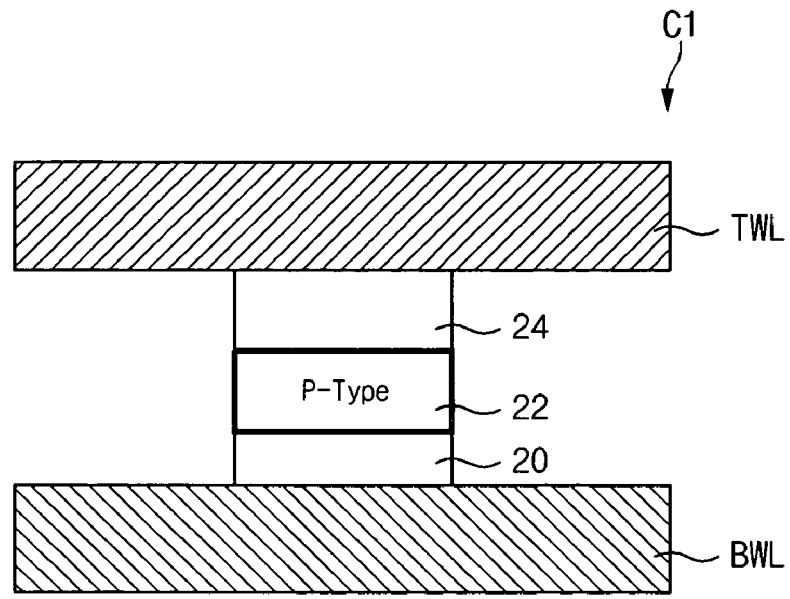
FIGS. 3a and 3b are cross-sectional diagrams illustrating a data cell of a data storing unit of FIG. 2.
Figure 3B:
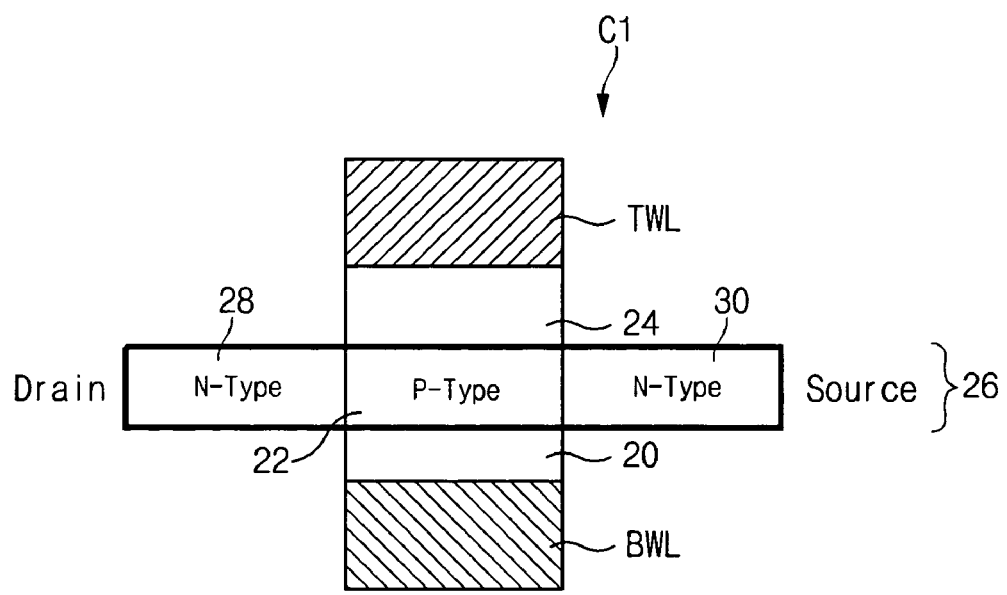

FIGS. 3a and 3b are cross-sectional diagrams illustrating the data cell C1 of a data storing unit 18 of FIG. 2.

FIG. 3a is a cross-sectional diagram illustrating the data cell C1 cut in a direction parallel to the top word line TWL and the bottom word line BWL.

In the data cell C1, an oxide film 20, a float channel layer 22 and a ferroelectric layer 24 are sequentially deposited on the bottom word line BWL. The top word line TWL is formed on the ferroelectric layer 24 in parallel with the bottom word line BWL.

FIG. 3b a cross-sectional diagram illustrating the data cell C1 cut in a direction perpendicular to the top word line TWL and the bottom word line BWL.

The float channel layer 26 includes a P-type float channel 22, a N-type region 28 that serves as a drain, and a N-type region 30 that serves as a source.

Preferably, the float channel layer 26 is formed of a carbon nano tube, silicon, Ge and an organic semiconductor.

As a result, a channel resistance of the float channel 22 is differentiated depending on the polarization of the ferroelectric layer 24.

Figure 4A:
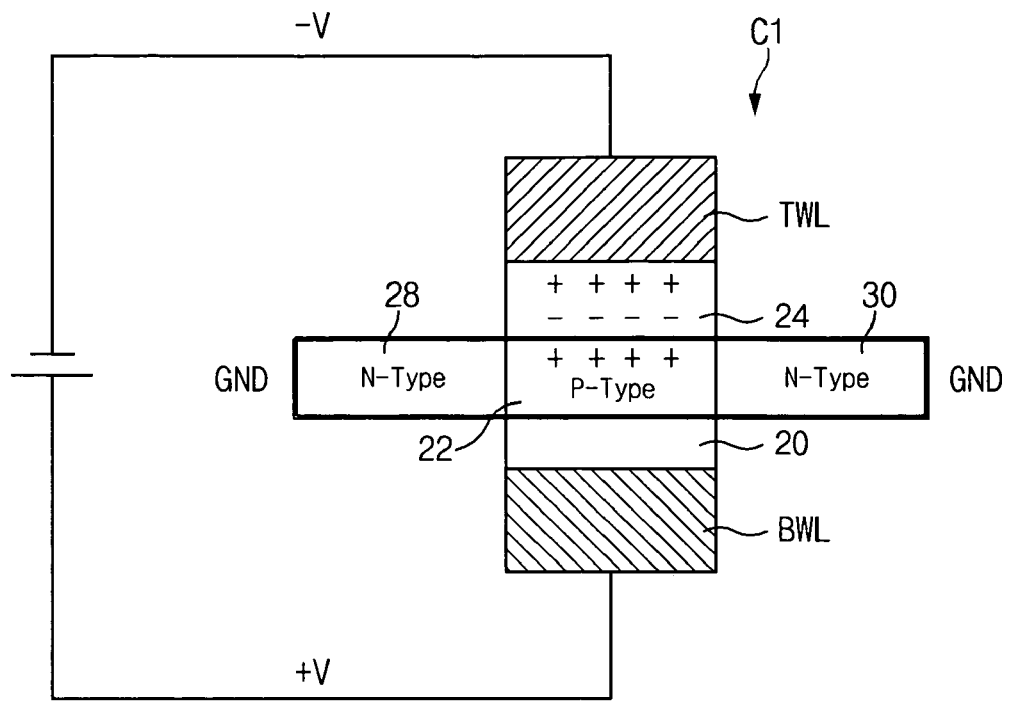
FIGS. 4a and 4b are diagrams illustrating write and read operations on high level data "1" in the data cell of the data storing unit of FIG. 2.
Figure 4B:
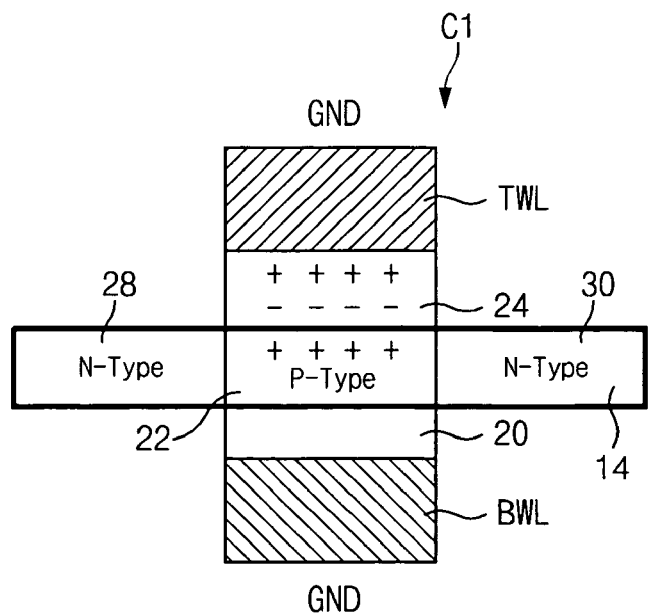

FIGS. 4a and 4b are diagrams illustrating write and read operations on high level data "1" in the data cell of the data storing unit of FIG. 2.

FIG. 4a is a diagram illustrating the write operation on the high level data "1".

A positive voltage +V is applied to the bottom word line BWL, and a negative voltage −V is applied to the top word line TWL. Here, the drain region 28 and the source region 30 are configured to be at a ground voltage GND state.

When a voltage is applied between the ferroelectric layer 24 and the float channel layer 26 by voltage distribution of a capacitor between the oxide film 20 and the ferroelectric layer 24, a polarization, which corresponds to the high level data "1", forms in the ferroelectric layer 24. The polarization formed in the ferroelectric layer 24 induces positive charges into the float channel 22 of the float channel layer 26.

FIG. 4b is a diagram illustrating the read operation on the high level data "1".

When a ground voltage GND is applied to the bottom word line BWL and the top word line TWL, the polarization formed in the ferroelectric layer 24 induces positive charges into the float channel 22 of the float channel layer 26. Here, since the drain region 28 and the source region 30 are at the ground state, the float channel 22 of the float channel layer 26 is turned off.

As a result, the data "1" stored in a memory cell can be read at a read mode. When a voltage difference is applied to the drain region 28 and the source region 30, the float channel layer 26 is at a turn-off state, so that no current flows indicating an "off" state.

Figure 5A:
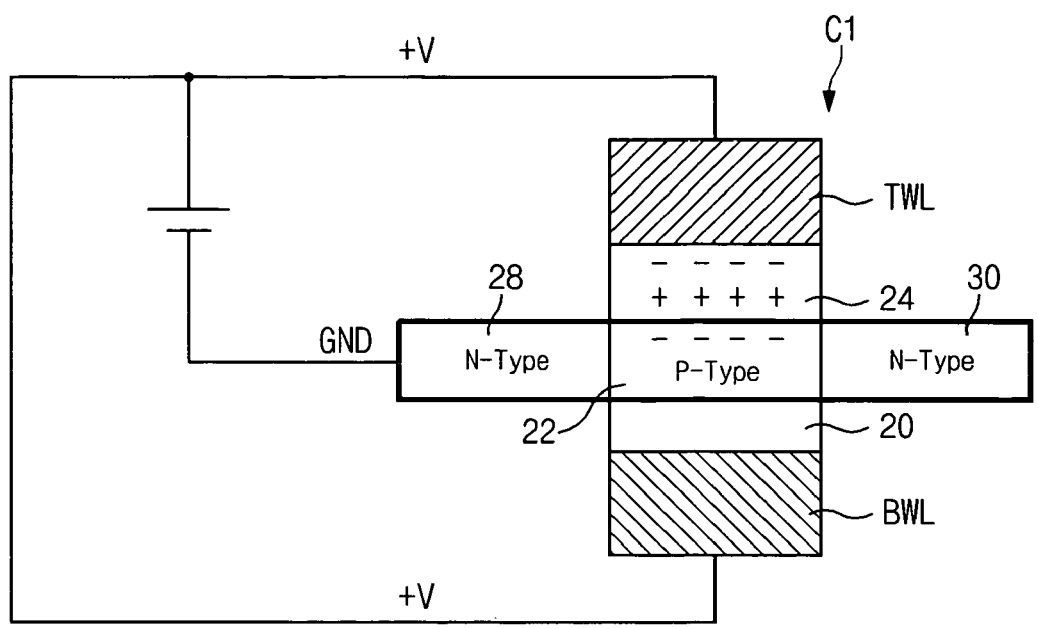
FIGS. 5a and 5b are diagrams illustrating write and read operations on high level data "0" in the data cell of the data storing unit of FIG. 2.
Figure 5B:
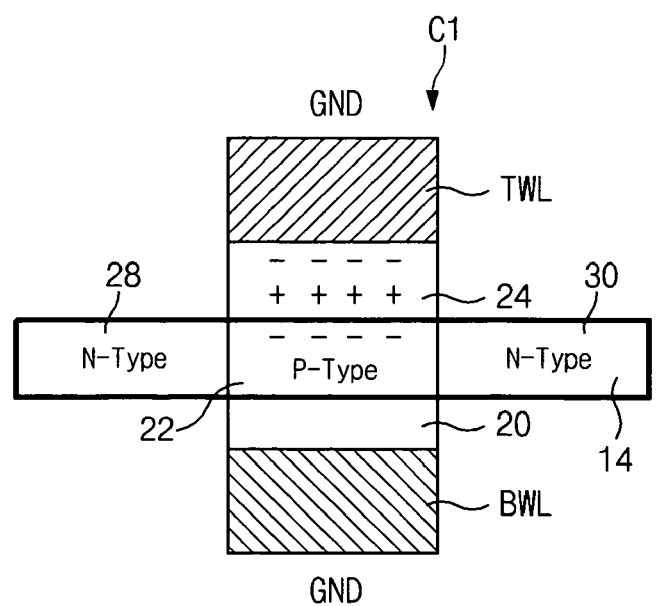

FIGS. 5a and 5b are diagrams illustrating write and read operations on low level data "0" in the data cell of the data storing unit of FIG. 2.

FIG. 5a is a diagram illustrating the write operation on the low level data "0".

When the ground voltage GND is applied to the drain region 28 and the source region 30 and the positive voltage +V is applied to the bottom word line BWL and the top word line TWL, the polarization, which corresponds to the low level data "0", of the ferroelectric layer 24 is formed. The polarization formed in the ferroelectric layer 24 induces negative charges into the float channel 22 of the float channel layer 26.

Since a high voltage is formed between the ground voltage of the float channel layer 26 and the positive voltage +V of the top word line TWL, electrons of the float channel layer 26 move into the ferroelectric layer 24, so that the electrons are accumulated in the ferroelectric layer 24.

Meanwhile, when the positive voltage +V is applied to the drain region 28 and the source region 30 while the high level data "1" is stored in the ferroelectric layer 24, the float channel layer 26 transitions to a turn-off state.

Since there is no voltage difference between the floated positive voltage of the float channel layer 26 and the positive voltage +V of the top word line TWL, electrons into the ferroelectric layer 24 does not move, so that the ferroelectric layer 24 maintains the previous state. As a result, the previously stored high level data "1" is maintained.

FIG. 5b is a diagram illustrating the read operation of the low level data "0".

When the ground voltage GND is applied to the bottom word line BWL and the top word line TWL and a voltage difference is applied between the drain 28 and the source 30, the float channel layer 26 is turned on, so that current flows indicating an "on" state.

As a result, since by the ground voltage applied to the bottom word line BWL and the top word line TWL at the above-described read mode, a voltage potential is not applied to the ferroelectric layer 24, so thereby improving the data retention characteristics of the memory cell.

Specifically, since a retaining characteristic of a ferroelectric memory register at a nano scale level becomes weakens at a low voltage potential, it is difficult to apply a random voltage to the top word line TWL at the read mode as with a conventional method.

However, the ferroelectric register according to an embodiment of the present invention can perform a low voltage operation at the nano scale.

Figure 6:
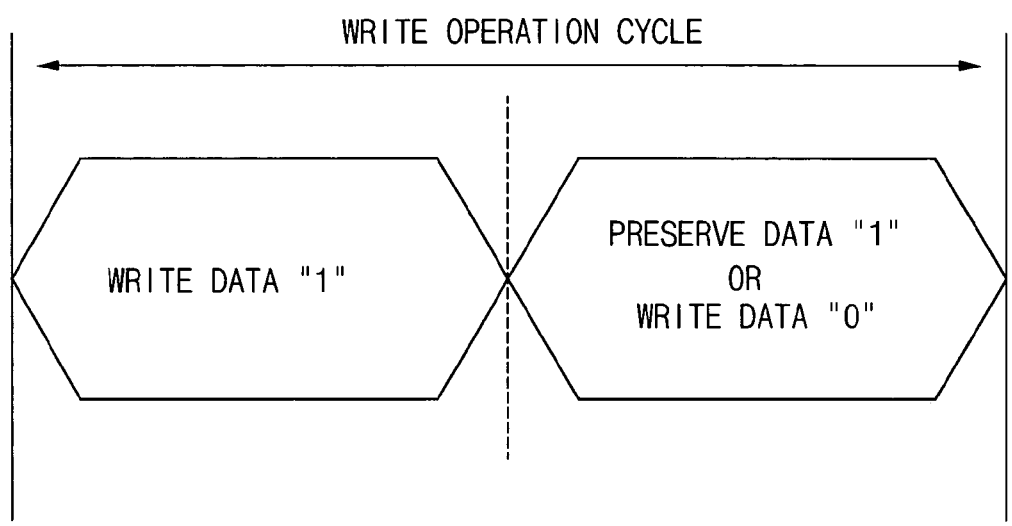
FIG. 6 is a diagram illustrating a write operation of the data cell of the data storing unit of FIG. 2.

FIG. 6 is a diagram illustrating a write operation of the data cell of the data storing unit of FIG. 2.

A write operation cycle of the data cell C1 is divided into two sub operation regions. That is, data "1" is written in the first sub operation region, and the data "1" written in the first sub operation region is preserved or the data "0" is written in the second sub operation region.

When the data "1" is required to be preserved, if a high voltage is applied to the bit line for a predetermined period, the data "1" written in the first sub operation region is preserved in the memory cell.

Figure 7:
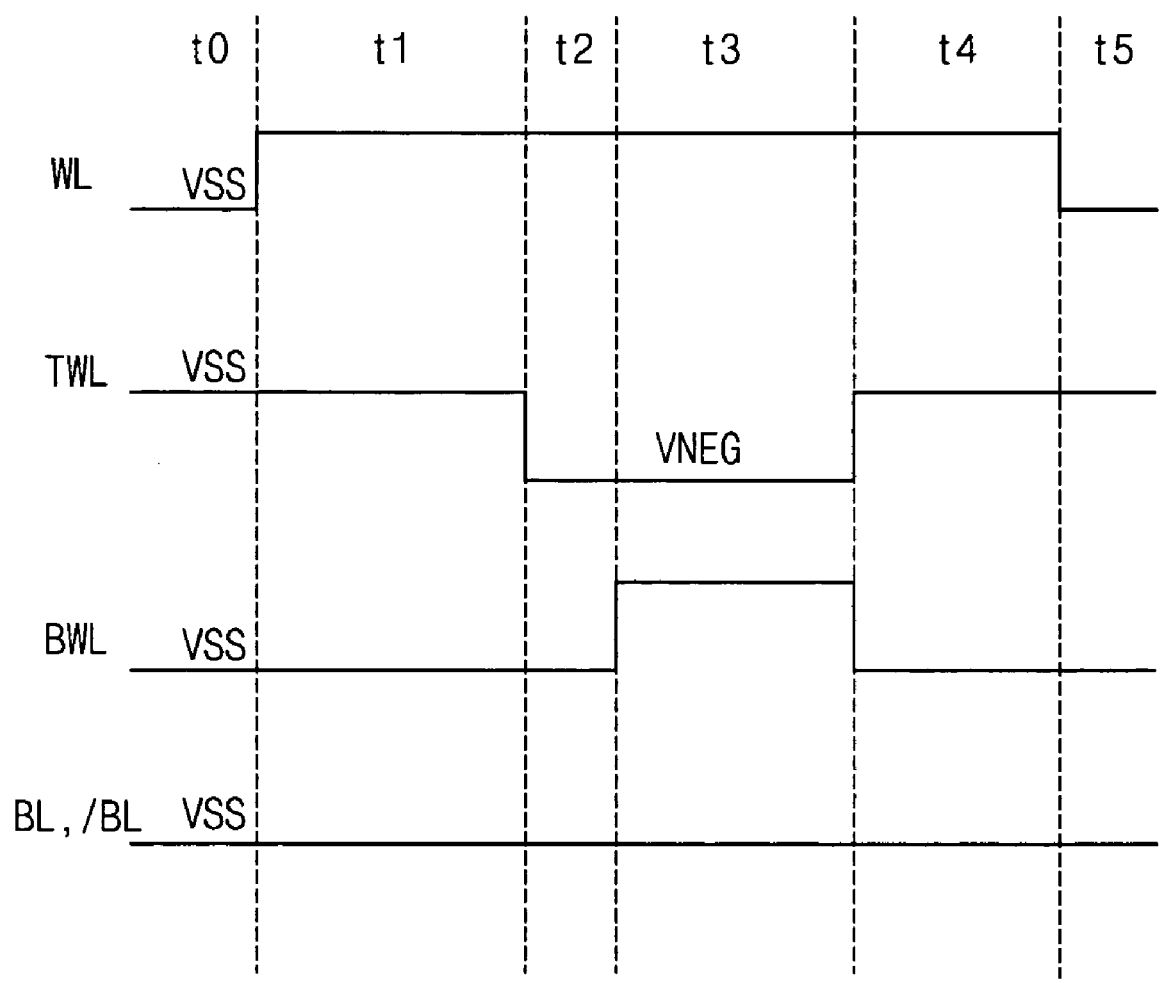
FIG. 7 is a diagram illustrating a read operation of the data cell of the data storing unit of FIG. 2.

FIG. 7 is a diagram illustrating a read operation of the data cell of the data storing unit of FIG. 2.

In a period t0 as a precharge period of the memory cell, all signals and lines are precharged to a ground voltage VSS.

In a period t1, a high level voltage is applied to the word line WL.

In a period t2, a negative voltage VNEG is applied to the top word line TWL.

In a period t3, when a high level voltage is applied to the bottom word line BWL, a high voltage is applied to the ferroelectric layer 24 by voltage distribution between the top word line TWL and the bottom word line BWL.

In a period t4, the top word line TWL and the bottom word line BWL is set at a ground state.

In a period t5, the word line WL is set at the ground state.

Figure 8:
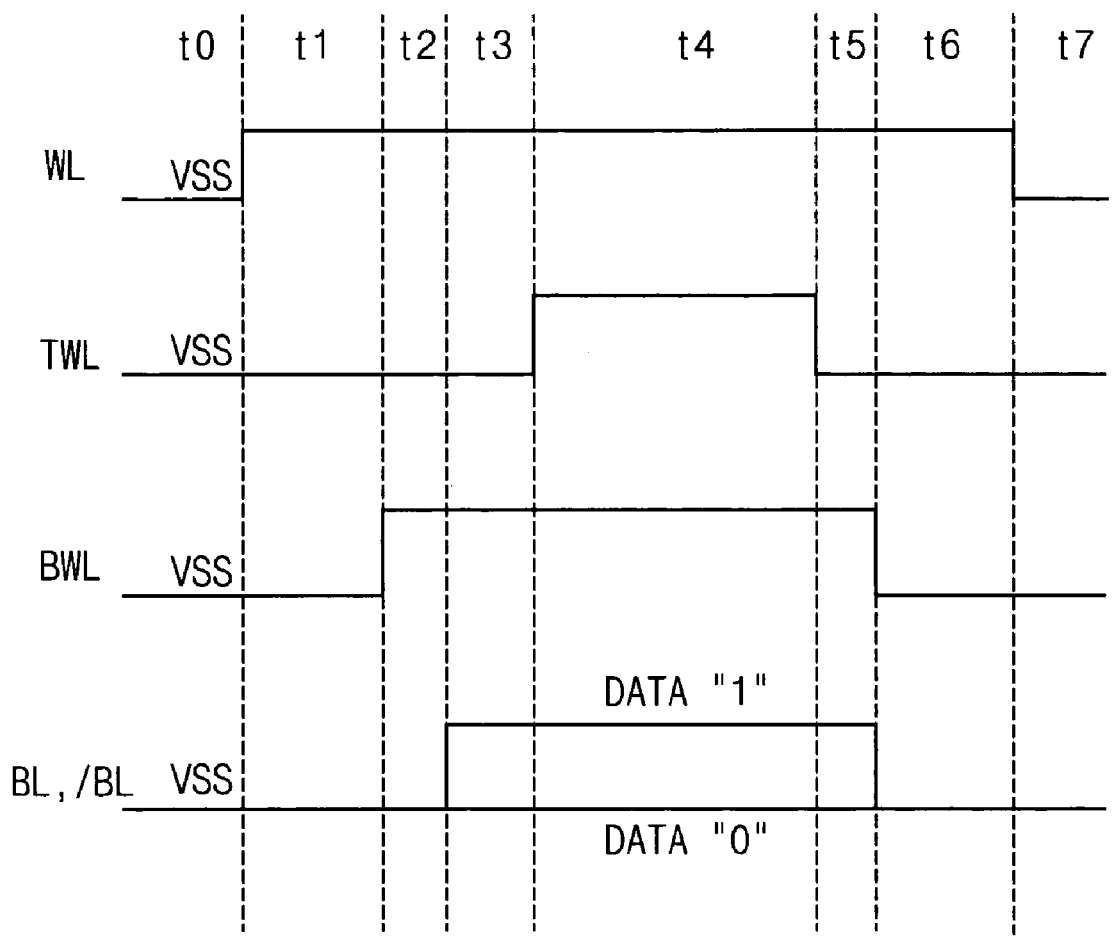
FIG. 8 is a timing diagram illustrating the operation to preserve the high level data "1" or write the low level data "0" in the data cell of the data storing unit of FIG. 2.

FIG. 8 is a timing diagram illustrating the operation to preserve the high level data "1" or write the low level data "0" in the data cell of the data storing unit of FIG. 2.

In a period t0 as a precharge period of the memory cell, all signals and lines are precharged to the ground voltage VSS.

In a period t1, a high level voltage is applied to the word line WL.

In a period t2, a high level voltage is applied to the bottom word line BWL.

In a period t3, the true bit line BL is continuously maintained at the ground state when data to be written is a low level "0", and a high level voltage is applied to the true bit line BL when the high level data "1" is preserved.

In a period t4, when a high level voltage is applied to the top word line TWL, electrons are accumulated in the floating channel layer 26, and the voltage difference between the top word line TWL and the floating channel layer 26 attains a threshold voltage difference. As a result, the ferroelectric layer 24 has a polarity that induces electrons into the float channel layer 26, and the low level data "0" is written.

Meanwhile, when a high level voltage is applied to the true bit line BL, a channel is prevented from being formed in the float channel layer 26, so that the low level data "0" is not written and the high level data "1" is preserved.

In a period t5, the top word line TWL is set at the ground state.

In a period t6, the bottom word line BLW and the bit lines BL, /BL are set at the ground state.

In a period t7, the word line WL is set at the ground state.

Figure 9:
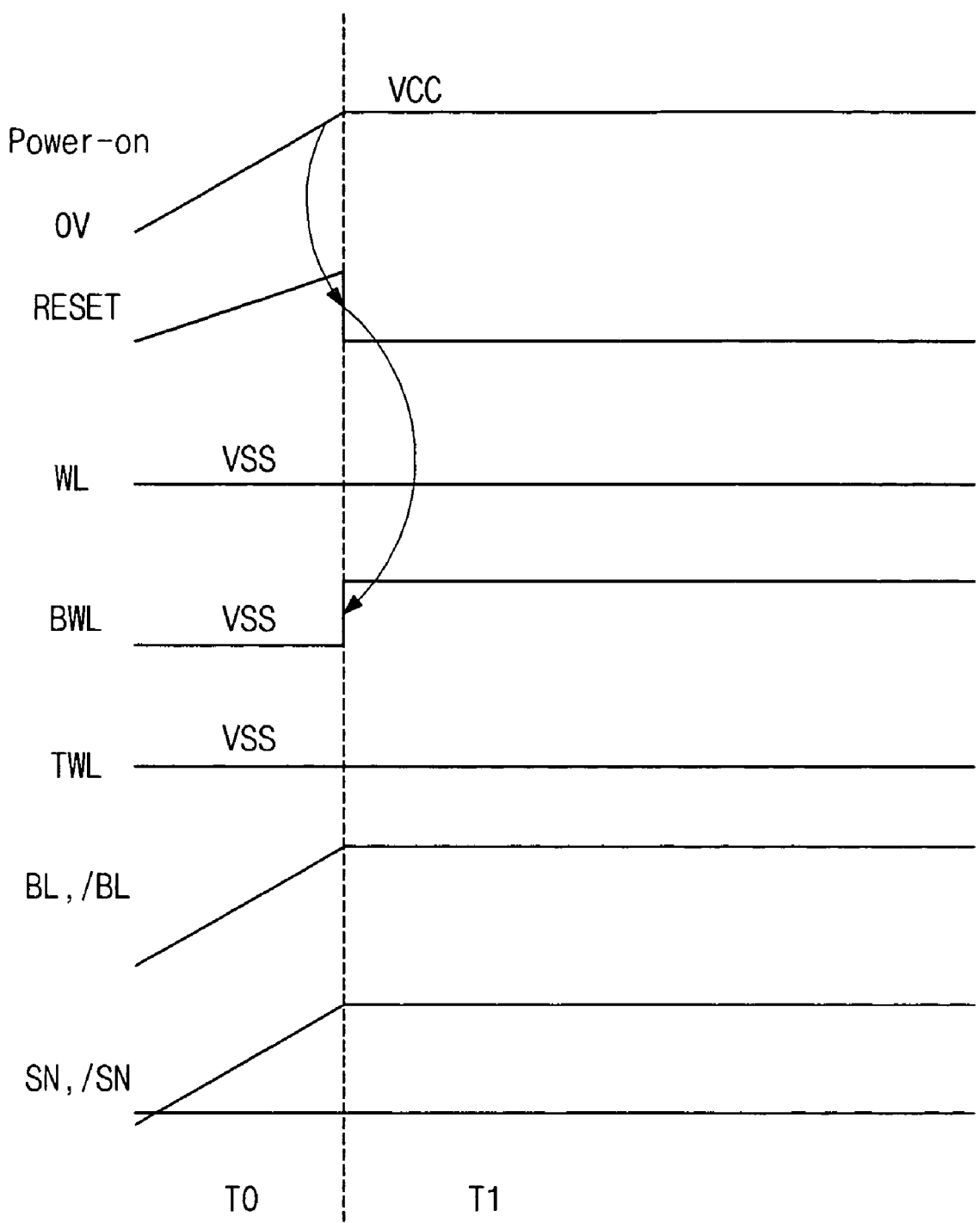
FIG. 9 is a timing diagram illustrating a recall operation at a power-on reset mode according to an embodiment of the present invention.

FIG. 9 is a timing diagram illustrating a recall operation at a power-on reset mode according to an embodiment of the present invention.

In a period t0, before a reset signal RESET is generated at a power-on mode, the storage nodes SN and /SN are set at a high level and a low level depending on data stored in the data cell C1 of the data storing unit 18 shown in FIG. 2.

In a period t1, when a power voltage VCC sufficiently rises to generate the reset signal RESET, the bottom word line BWL is set at the high level, so that the data of the storage nodes SN and /SN are bypassed through a control terminal of the bottom word line BWL.

When the word line WL is maintained at the low level and the bit lines BL and /BL rise to the same level of a power voltage VCC, a register state is restored by a program state of the pull-up driving unit 12.

As described above, in a nonvolatile semiconductor memory device according to an embodiment of the present invention, data are not destroyed even when a power source is intercepted.

Also, the nonvolatile semiconductor memory device according to an embodiment of the present invention restores a data state store at a power-on mode.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile semiconductor memory device including a plurality of data registers,
   wherein each of the plurality of data registers comprises:
   a storage node;
   a pull-up driving unit adapted and configured to pull up the storage node and having a latch structure where its control terminal is cross-coupled with the storage node;
   a pull-down driving unit adapted and configured to pull down the storage node and having a latch structure where its control terminal is cross-coupled with the storage node;
   a data input/output unit adapted and configured to selectively input and output data between a bit line and the storage node depending on a voltage applied to a word line; and
   a data storing unit adapted and configured to store data of the storage node in a ferroelectric layer depending on a voltage applied to a top word line and a bottom word line or to output data that corresponds to resistance change of a float channel layer according to a polarization state of charges stored in the ferroelectric layer to the storage node and read the outputted data.

2. The nonvolatile semiconductor memory device according to claim 1, wherein each of the plurality of nonvolatile memory cells comprises:
   the bottom word line;
   the float channel layer formed on the bottom word line;
   the ferroelectric layer formed on the float channel layer, and adapted and configured to store data; and
   the top word line formed on the ferroelectric layer in parallel with the bottom word line, wherein the float channel layer attains resistance state that corresponds to data stored in the storage node at a write mode and attains resistance state corresponds to data stored in the ferroelectric layer at a read mode.

3. The nonvolatile semiconductor memory device according to claim 2, wherein the float channel layer is formed of at least one of a carbon nano tube, silicon, germanium, and an organic semiconductor.

4. The nonvolatile semiconductor memory device according to claim 2, wherein each of the plurality of nonvolatile memory cells writes data into the ferroelectric layer depending on a level of the top word line while the bottom word line is selected.

5. The nonvolatile semiconductor memory device according to claim 2, wherein each of the plurality of nonvolatile memory cells induces different channel resistances in the float channel layer to read corresponding data depending on a polarization state of charges stored in the ferroelectric layer.

6. The nonvolatile semiconductor memory device according to claim 2, wherein the float channel layer attains a high resistance state to be turned off when the polarization state of charges stored in the ferroelectric layer induces positive charges into the float channel of the float channel layer.

7. The nonvolatile semiconductor memory device according to claim 2, where in the float channel layer attains a low resistance state to be turned on when the polarization state of charges stored in the ferroelectric layer induces negative charges into the float channel of the float channel layer.

8. The nonvolatile semiconductor memory device according to claim 2, wherein high level data are written in the ferroelectric layer when: a positive voltage is applied to the bottom word line; a negative voltage is applied to the top word line; and a ground voltage is applied to a drain region and a source region.

9. The nonvolatile semiconductor memory device according to claim 8, wherein the polarization state of charges stored in the ferroelectric layer induces positive charges into the float channel of the float channel layer and high level data are read, when a ground voltage is applied to the bottom word line and the top word line.

10. The nonvolatile semiconductor memory device according to claim 8, wherein a previously stored high level data in the ferroelectric layer is maintained when a positive voltage is applied to the bottom word line and the top word line, a positive voltage is applied to a drain region and a source region.

11. The nonvolatile semiconductor memory device according to claim 2, wherein low level data are written in the ferroelectric layer when a positive voltage is applied to the bottom word line and the top word line and a ground voltage is applied to a drain region and a source region.

12. The nonvolatile semiconductor memory device according to claim 11, wherein the polarization state of charges stores in the ferroelectric layer induces negative charges into the float channel of the float channel layer and low level data are read, when a ground voltage is applied to the bottom word line and the top word line.

13. The nonvolatile semiconductor memory device according to claim 1, wherein the pull-up driving unit comprises a plurality of PMOS transistors each configured to have a gate cross-coupled to the stores node with a latch type circuit.

14. The nonvolatile semiconductor memory device according to claim 1, wherein the pull-down driving unit comprises a plurality of NMOS transistors each configured to have a gate cross-coupled to the storage node with a latch type circuit.

15. The nonvolatile semiconductor memory device according to claim 1, wherein each of the data input/output units comprises a plurality of switch units each adapted and configured to selectively input and output data between the bit line and the storage node of a corresponding one of the plurality of data registers depending on a voltage applied to the word line.

16. The nonvolatile semiconductor memory device according to claim 15, wherein the switch unit is a NMOS transistor configured to have a gate connected to the word line.

17. The nonvolatile semiconductor memory device according to claim 1, wherein the data stored in the data storing unit of the data register are restored by a program state of the pull-up driving unit at a power-on mode.

* * * * *